(12) United States Patent
Koo et al.

(10) Patent No.: US 11,914,891 B2
(45) Date of Patent: Feb. 27, 2024

(54) STORAGE DEVICE AND OPERATING METHOD THEREOF

(71) Applicant: SK hynix Inc., Gyeonggi-do (KR)

(72) Inventors: Byung Hee Koo, Gyeonggi-do (KR); No Hyeon Bae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 24 days.

(21) Appl. No.: 17/708,822

(22) Filed: Mar. 30, 2022

(65) Prior Publication Data

US 2023/0115457 A1 Apr. 13, 2023

(30) Foreign Application Priority Data

Oct. 7, 2021 (KR) ........................ 10-2021-0133207

(51) Int. Cl.
*G06F 3/06* (2006.01)

(52) U.S. Cl.
CPC ............ *G06F 3/0656* (2013.01); *G06F 3/064* (2013.01); *G06F 3/0616* (2013.01); *G06F 3/0679* (2013.01)

(58) Field of Classification Search
None
See application file for complete search history.

(56) References Cited

U.S. PATENT DOCUMENTS

| 2019/0043604 | A1* | 2/2019 | Baca | G11C 29/883 |
| 2022/0413739 | A1* | 12/2022 | Luo | G06F 3/061 |

FOREIGN PATENT DOCUMENTS

| KR | 10-2015-0133913 A | 12/2015 | |
| KR | 10-2020-0048978 A | 5/2020 | |
| WO | WO-2013101050 A1 * | 7/2013 | G06F 12/00 |

* cited by examiner

*Primary Examiner* — Kevin Verbrugge
(74) *Attorney, Agent, or Firm* — IP & T GROUP LLP

(57) ABSTRACT

A storage device can guarantee data write-requested from a host. The storage device includes: a buffer memory for storing data write-requested from the host; a memory device including user blocks, reserved blocks which substitute for the user blocks, and power loss protection blocks for storing buffer data stored in the buffer memory when a sudden power loss occurs, in which a power supply is abnormally interrupted; and a memory controller for determining whether any memory block capable of storing the write-requested data among the user blocks and the reserved blocks exists in response to a write operation error of the user blocks and the reserved blocks, and changing to a user block, one or more power loss protection blocks among the power loss protection blocks according to whether any memory block capable of storing the write-requested data exists.

18 Claims, 10 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0133207 filed on Oct. 7, 2021, the entire disclosure of which is incorporated herein by reference.

BACKGROUND

1. Field of Invention

The present disclosure generally relates to an electronic device, and more particularly, to a storage device and an operating method thereof.

2. Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a storage device capable of guaranteeing data write-requested from a host, and an operating method of the storage device.

In accordance with an embodiment of the present disclosure, there is provided a storage device including: a buffer memory configured to store data write-requested from a host; a memory device including a plurality of user blocks, a plurality of reserved blocks which substitute for the plurality of user blocks, and a plurality of power loss protection blocks for storing buffer data in the buffer memory when sudden power loss occurs in which power supply is abnormally interrupted; and a memory controller configured to determine whether any memory block capable of storing the write-requested data among the plurality of user blocks and the plurality of reserved blocks exists in response to a write operation error of the plurality of user blocks and the plurality of reserved blocks, and change, to a user block, one or more power loss protection blocks among the plurality of power loss protection blocks according to whether any memory block capable of storing the write-requested data exists.

In accordance with another aspect of the present disclosure, there is provided a method of operating a storage device, the method including: receiving write-requested data from a host; performing a write operation of storing the write-requested data in a plurality of user blocks and a plurality of reserved blocks; detecting a write operation error of the plurality of user blocks and the plurality of reserved blocks; determining whether any memory block capable of storing the write-requested data among the plurality of user blocks and the plurality of reserved blocks exists, in response to the write operation error; and changing, to a user block, one or more power loss protection blocks among a plurality of power loss protection blocks according to whether any memory block capable of storing the write-requested data among the plurality of user blocks and the plurality of reserved blocks exists.

In accordance with another aspect of the present disclosure, the method further includes: determining whether any reserved block for substituting for a user block in which the write operation error occurs among the plurality of reserved blocks exists and determining that any memory block capable of storing the write-requested data among the plurality of user blocks and the plurality of reserved blocks does not exist, in response to any reserved block for substituting for the user block in which the write operation error occurs does not exist.

In accordance with another aspect of the present disclosure, the method further includes: determining that a memory device has entered into an End Of Life (EOL) state in response to any reserved block for substituting for a user block in which the write operation error occurs does not exist.

In accordance with another aspect of the present disclosure, in the method of operating the storage device, the one or more power loss protection blocks are changed to the user blocks in response to any memory block capable of storing the write-requested data among the plurality of user blocks and the plurality of reserved blocks does not exist.

In accordance with still another embodiment of the present disclosure, there is provided a memory controller for controlling a buffer memory for storing data write-requested from a host and a memory device including a plurality of user blocks, a plurality of reserved blocks, and a plurality of power loss protection blocks, the memory controller including: a write operation controller configured to control the buffer memory and the memory device to perform a write operation of storing the write-requested data in the plurality of user blocks and the plurality of reserved blocks; and a memory block manager configured to change, to a user block, one or more power loss protection blocks among the plurality of power loss protection blocks in response to a write operation error occurring according to fail of the write operation.

In accordance with an embodiment of the present disclosure, the memory block manager is further configured to determine whether any memory block capable of storing the write-requested data among the plurality of user blocks and the plurality of reserved blocks exists, in response to the write operation error.

In accordance with an embodiment of the present disclosure, the memory block manager is further configured to change the one or more power loss protection blocks to the user blocks when any memory block capable of storing the write-requested data among the plurality of user blocks and the plurality of reserved blocks does not exist.

In accordance with an embodiment of the present disclosure, there is provided a memory system including a memory device including a first memory block designated to operate for a first purpose and a second memory block designated to operate for a second purpose and a controller configured to re-designate the second memory block to operate for the first purpose when determining the first memory block as incapable of operating for the first purpose, wherein the first purpose is storing, in a memory block, write-requested data buffered in a buffer.

In accordance with an embodiment of the present disclosure, there is provided a memory system including a device including a first memory block designated to operate for a first purpose and a second memory block designated to operate for a second purpose; and a controller configured to re-designate the second memory block to operate for the first purpose when determining an auxiliary power supply to have a lower level than a threshold to supply an auxiliary power source to the device and the controller, wherein the first purpose is storing, in a memory block, write-requested data buffered in a buffer.

BRIEF DESCRIPTION OF THE DRAWINGS

Various embodiments of the present disclosure will now be described more fully hereinafter with reference to the accompanying drawings; however, the embodiments may be in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Figure 1:
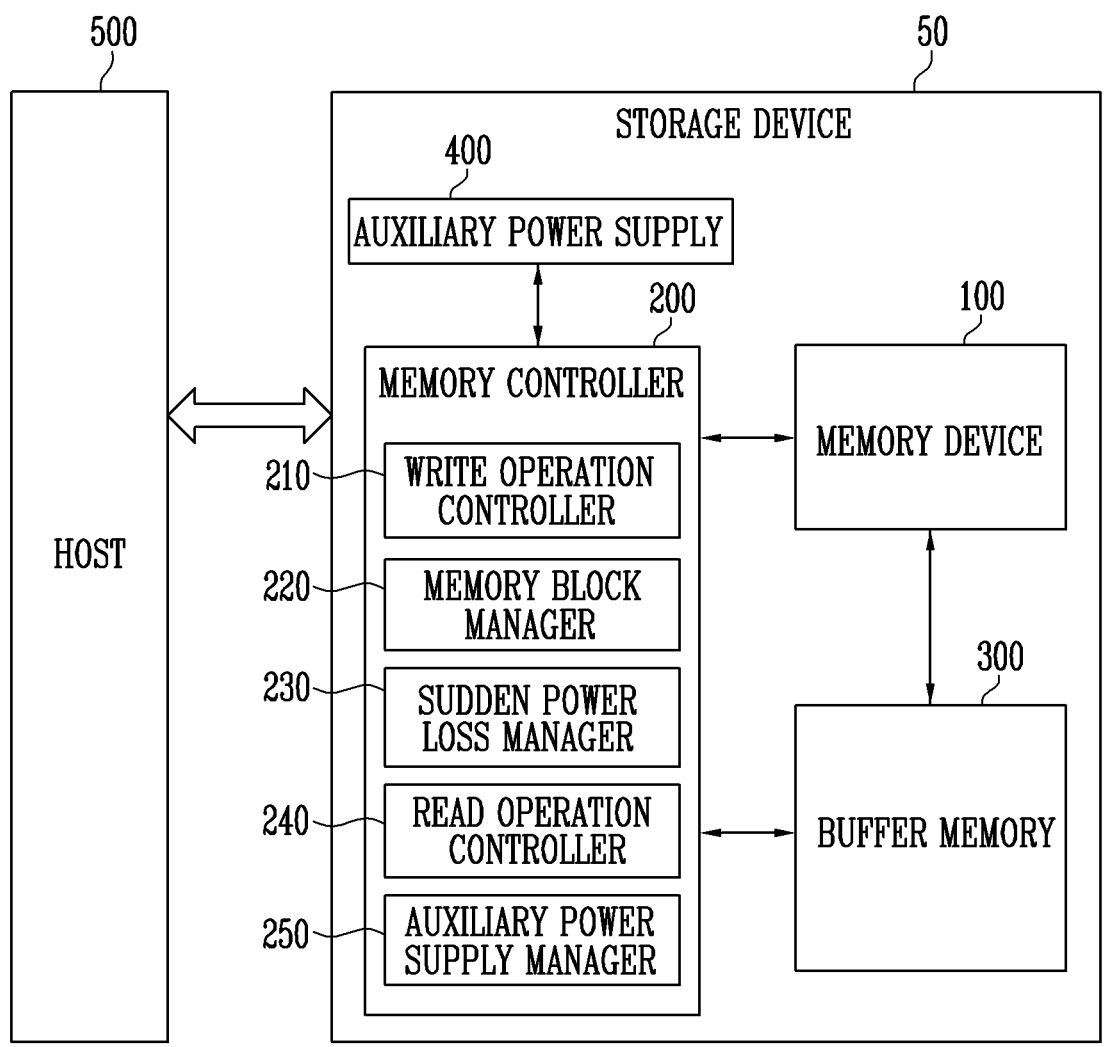
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device (also referred to as a memory system) 50 may include a memory device 100 and a memory controller 200 for controlling an operation of the memory device 100. The storage device 50 may be a device for storing data under the control of a host 500, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 500. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any of various package types. For example, the storage device 50 may be manufactured as any of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR) SDRAM, a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or the like. In this specification, for convenience of description, a case where the memory device 100 is a NAND flash memory is described.

The memory device 100 may receive a command CMD and an address ADDR from the memory controller 200, and access an area selected by the address ADDR in the memory cell array. The memory device 100 may perform an operation indicated by the command CMD on the area selected by the address ADDR. For example, the memory device 100 may perform a write operation (program operation), a read operation, and an erase operation. In the write operation, the memory device 100 may program data in the area selected by the address ADDR. In the read operation, the memory device 100 may read data from the area selected by the address ADDR. In the erase operation, the memory device 100 may erase data stored in the area selected by the address ADDR.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 500, a flash translation layer (FTL) for controlling communication between the host 500 and the memory device 100, and a flash interface layer (FIL) for controlling communication with the memory device 100.

In an embodiment, the memory controller 200 may receive data and a Logical Block Address (LBA) from the host 500, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a write operation, a read operation, an erase operation, or the like in response to a request from the host 500. In the write operation, the memory controller 200 may provide a write command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may be connected to the memory device 100 through a channel. For example, the memory controller 200 may control the memory device 100 to perform a write operation, a read operation, an erase operation, or the like by providing a command and an address to the memory device 100 through the channel.

In an embodiment, the memory controller 200 may autonomously generate a command, an address, and data regardless of any request from the host 500, and transmit the command, the address, and the data to the memory device 100. For example, the memory controller 200 may provide the memory device 100 with a command, an address, and data, which are used to perform read and write operations accompanied in performing wear leveling, read reclaim, garbage collection, etc.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

A buffer memory 300 may be a volatile memory device. The memory controller 200 may control the buffer memory 300 to temporarily store data to be stored in the memory device 100 according to a request of the host 500. The data stored in the buffer memory 300 may be stored in a pre-allocated area in the buffer memory 300 according to a logical address.

Referring to FIG. 1, it is illustrated that the buffer memory 300 is located at the outside of the memory controller 200 while being included in the storage device 50. However, in various embodiments, the buffer memory 300 may be located in the memory controller 200.

An auxiliary power supply 400 may store an auxiliary power source with an external power source supplied from the host 500. The auxiliary power supply 400 may provide the auxiliary power source to the memory device 100, the memory controller 200, and the buffer memory 300.

In an embodiment, a voltage level of the external power source supplied to the storage device 50 may become lower than a specific voltage level. For example, Sudden Power Loss (SPL) may occur, in which the external power source is suddenly interrupted. The memory device 100, the memory controller 200, and the buffer memory 300 may perform various operations of which performance completion is to be guaranteed before the power source is interrupted. For example, it is necessary for the memory controller 200 to control data temporarily stored in a write cache buffer included in the storage device 50 to be stored in the memory device 100 before the power source is interrupted. In another example, a map update operation of storing mapping data between a logical address and a physical address in the memory device 100 may also be performed before the power source is interrupted. Before the power source is interrupted, the auxiliary power source may be provided to the memory device 100, the memory controller 200, and the buffer memory 300 for a certain time to perform operations of which performance completion is to be guaranteed.

In an embodiment, the auxiliary power supply 400 may include a plurality of auxiliary power cells. The auxiliary power supply 400 may charge a voltage corresponding to the auxiliary power source in the auxiliary power cells, based on the external power source. The auxiliary power supply 400 may provide the auxiliary power source to the memory device 100, the memory controller 200, and the buffer memory 300 by using the charged voltage. Since the auxiliary power source is supplied by the auxiliary power cells included in the auxiliary power supply 400, the auxiliary power source may have a limited magnitude.

The host 500 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

In an embodiment, the memory controller 200 may include a write operation controller 210, a memory block manager 220, a sudden power loss manager 230, a read operation controller 240, and an auxiliary power supply manager 250.

The write operation controller 210 may control a write operation of storing data write-requested from the host 500 in response to a write request of the host 500. For example, when the write request and the write-requested data are received from the host 500, the write operation controller 210 may control the buffer memory 300 to store the write-requested data. Also, the write operation controller 210 may control the memory device 100 to store, in a plurality of memory blocks, the write-requested data stored in the buffer memory 300.

The memory block manager 220 may manage a plurality of memory blocks.

In an embodiment, the plurality of memory blocks may include a plurality of user blocks, a plurality of reserved blocks, and a plurality of Power Loss Protection (PLP) blocks. Each of the blocks will be described with reference to FIG. 4 which will be described later.

In an embodiment, the memory block manager 220 may determine whether any memory block capable of storing the write-requested data among the plurality of user blocks and the plurality of reserved blocks exists, in response to a write operation error. For example, the write operation error may occur in the plurality of user blocks, and any reserved block to substitute for a user block in which the write operation error occurs may not exist. The memory block manager 220 may determine that any memory block capable of storing the write-requested data among the plurality of user blocks and the plurality of reserved blocks does not exist.

Also, the memory block manager 220 may change one or more power loss protection blocks to user blocks according to whether any memory block capable of storing the write-requested data exists. For example, when any memory block capable of storing the write-requested data among the plurality of user blocks and the plurality of reserved blocks does not exist, the memory block manager 220 may change one or more power loss protection blocks to user blocks.

The sudden power loss manager 230 may sense occurrence of a sudden power loss in which the power supply is abnormally interrupted, and perform a sudden power loss recovery operation. The sudden power loss recovery operation may be an operation for checking up to which page a write operation of the memory device 100 has been performed, which was performed before the sudden power loss occurs, and continuously performing the write operation of the memory device 100, which was performed before the sudden power loss occurs. For example, sudden power loss may occur, in which a power source is suddenly interrupted in the storage device 50 while the memory device 100 performs the write operation. The sudden power loss manager 230 may control the buffer memory 300 and the memory device 100 to store buffer data stored in the buffer memory 300 in a plurality of power loss protection blocks. In an embodiment, the buffer data may be data stored in the buffer memory 300. When the power source is again supplied after the sudden power loss occurs, the sudden power loss manager 230 may perform the sudden power loss recovery operation.

In an embodiment, when the sudden power loss occurs, the sudden power loss manager 230 may control the buffer memory 300 and the memory device 100 to store the write-requested data stored in the buffer memory in the one or more power loss protection blocks changed to the user blocks.

The read operation controller 240 may control a read operation of reading read-requested data in response to a read request of the host 500.

In an embodiment, when a read request for the write-requested data is received from the host 500 before the sudden power loss occurs, the read operation controller 240 may control the buffer memory 300 to read data, which is buffered therein, corresponding to the read request. The read operation controller 240 may provide the host 500 with the data read from the buffer memory 300.

In an embodiment, when a read request for the write-requested data is received from the host 500 after the power supply is recovered, the read operation controller 240 may control the memory device 100 to read data corresponding to the read request from one or more power loss protection blocks. The read operation controller 240 may provide the host 500 with the data read from the one or more power loss protection blocks.

The auxiliary power supply manager 250 may control the auxiliary power supply 400 or monitor a voltage charged in the auxiliary power supply 400.

In an embodiment, the auxiliary power supply manager 250 may determine whether a magnitude of the voltage charged in the auxiliary power supply 400 is less than a threshold value. When the magnitude of the charged voltage is less than the threshold value, the auxiliary power supply manager 250 may provide the memory block manager 220 with information on the voltage charged in the auxiliary power supply 400.

In an embodiment, the memory block manager 220 may change one or more power loss protection blocks to reserved blocks, based on information on the charged voltage. For example, when the magnitude of the voltage charged in the auxiliary power supply 400 is less than the threshold value, the memory block manager 220 may determine that the memory device 100 has entered into an End Of Life (EOL) state. Also, when the magnitude of the voltage charged in the auxiliary power supply 400 is less than the threshold value, the memory block manager 220 may change one or more power loss protection blocks to reserved blocks. For example, the one or more power loss protection blocks are the other power loss protection blocks except power loss protection blocks used for storing the buffer data according to the magnitude of the charged voltage in the occurrence of the sudden power loss among the plurality of power loss protection blocks.

That is, when the memory device 100 enters into the EOL state, the magnitude of the voltage charged in the auxiliary power supply 400 may be decreased as compared with an initial voltage. When the sudden power loss occurs, the time for which the power supply can be maintained through the auxiliary power supply 400 is decreased, and therefore, the size of data stored in a power loss protection block may be decreased. That is, when the memory device 100 enters into the EOL state, some of the plurality of power loss protection blocks may not be used.

Thus, in accordance with an embodiment of the present disclosure, a power loss protection block is changed to a reserved block, based on the magnitude of the voltage charged in the auxiliary power supply 400, so that the plurality of power loss protection blocks can be efficiently managed.

Figure 2:
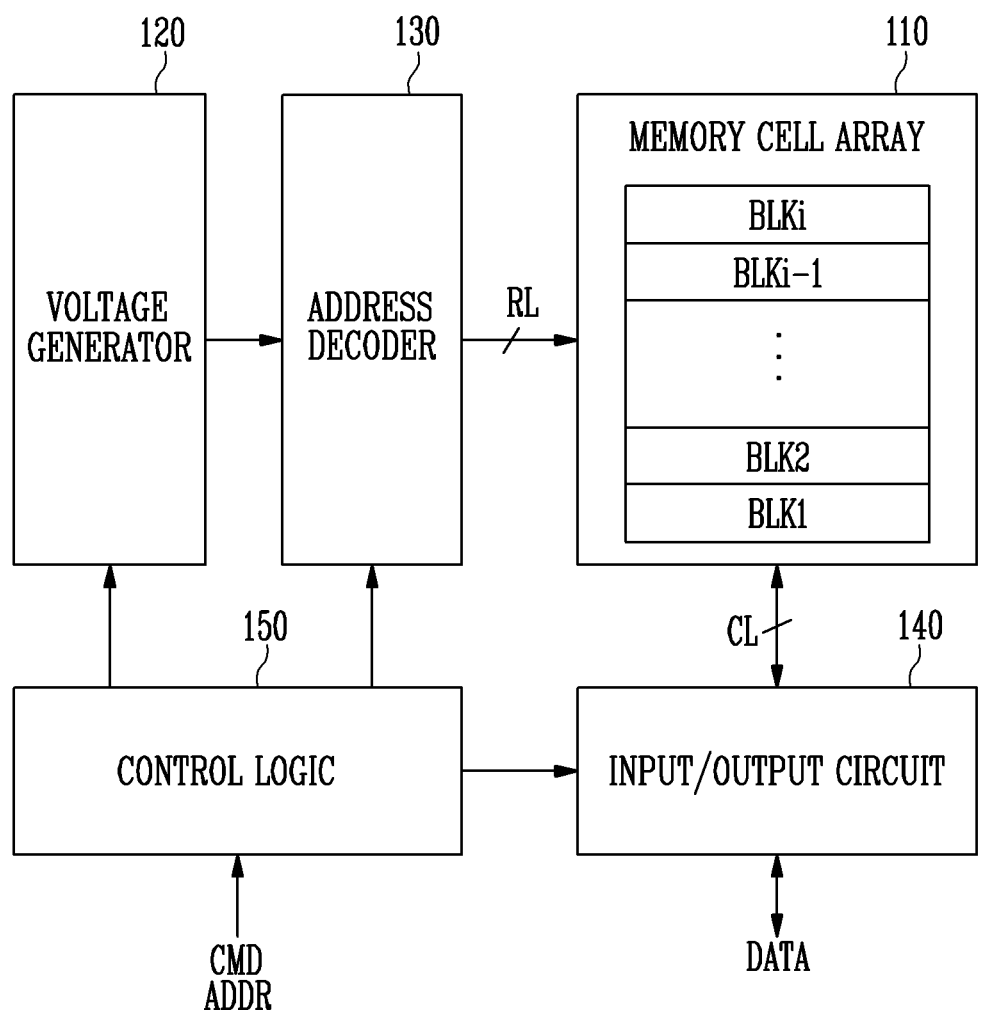
FIG. 2 is a diagram illustrating a memory device shown in FIG. 1 in accordance with an embodiment of the present disclosure.

FIG. 2 is a diagram illustrating the memory device shown in FIG. 1 in accordance with an embodiment of the present disclosure.

Referring to FIG. 2, the memory device 100 may include a memory cell array 110, a voltage generator 120, an address decoder 130, an input/output circuit 140, and a control logic 150.

The memory cell array 110 may include a plurality of memory blocks BLK1 to BLKi. The plurality of memory blocks BLK1 to BLKi may be connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

In an embodiment, the voltage generator 120, the address decoder 130, and the input/output circuit 140 may be commonly designated as a peripheral circuit. The peripheral circuit may drive the memory cell array 110 under the control of the control logic 150. The peripheral circuit may drive the memory cell array 110 to perform a write operation, a read operation, and an erase operation.

The voltage generator 120 may generate a plurality of operating voltages by using an external power voltage supplied to the memory device 100. The voltage generator 120 may operate under the control of the control logic 150.

In an embodiment, the voltage generator 120 may generate an internal power voltage by regulating the external power voltage. The internal power voltage generated by the voltage generator 120 may be used as an operating voltage of the memory device 100.

In an embodiment, the voltage generator 120 may generate a plurality of operating voltages by using the external power voltage or the internal power voltage. The voltage generator 120 may generate various voltages required in the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 120 may include a plurality of camping capacitors which receive the internal power voltage. The voltage generator 120 may generate the plurality of operating voltages by selectively activating the plurality of pumping capacitors under the control of the control logic 150.

The plurality of operating voltages generated by the voltage generator 120 may be supplied to the memory cell array 110 by the address decoder 130.

The address decoder 130 may be connected to the memory cell array 110 through the row lines RL. The address decoder 130 may operate under the control of the control logic 150. The address decoder 130 may receive an address ADDR from the control logic 150. The address decoder 130 may decode a block address in the received address ADDR. The address decoder 130 may select at least one memory block among the memory blocks BLK1 to BLKi according to the decoded block address. The address decoder 130 may decode a row address in the received address ADDR. The address decoder 130 may select at least one word line among word lines of the selected memory block according to the decoded row address. In an embodiment, the address decoder 130 may decode a column address in the received address ADDR. The address decoder 130 may connect the input/output circuit 140 and the memory cell array 110 to each other according to the decoded column address.

In accordance with an embodiment of the present disclosure, in a read operation, the address decoder 130 may apply a read voltage to the selected word line, and apply a read pass voltage having a level higher than that of the read voltage to unselected word lines.

The address decoder 130 may include components such as a row decoder, a column decoder, and an address decoder.

The input/output circuit 140 may include a plurality of page buffers (not shown). The plurality of page buffers may be connected to the memory cell array 110 through the bit lines. In a write operation, data may be stored in selected memory cells according to data stored in the plurality of page buffers.

In a read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to a command CMD transferred from an external device. The control logic 150 may control the peripheral circuit by generating control signals in response to the command CMD and the address ADDR.

Figure 3:
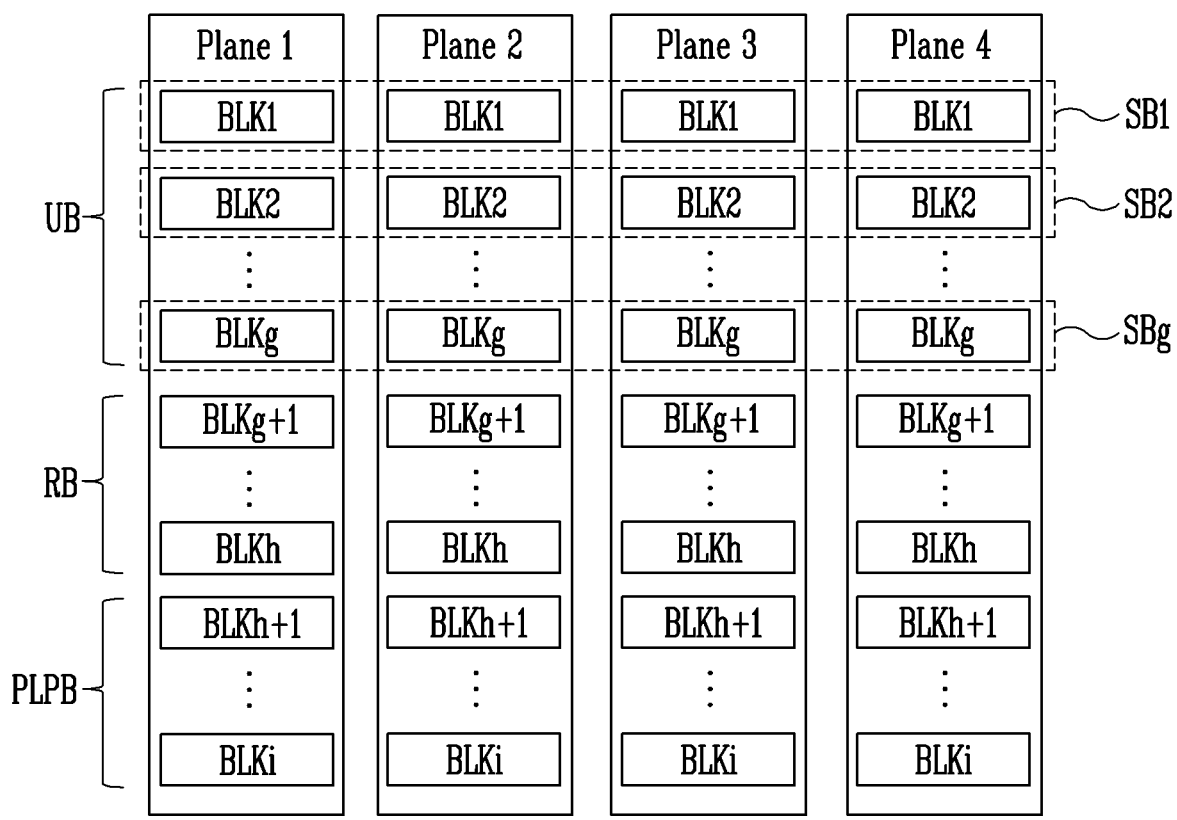
FIG. 3 is a diagram illustrating a configuration of memory blocks in accordance with an embodiment of the present disclosure.

FIG. 3 is a diagram illustrating a configuration of memory blocks in accordance with an embodiment of the present disclosure.

Referring to FIG. 3, the memory device 100 may include a plurality of planes Plane 1 to Plane 4. One plane may include a plurality of memory blocks BLK1 to BLKi, where i is a positive integer. Although a case where the memory device 100 includes four planes is illustrated in FIG. 3, this is for convenience of description, and the number of planes included in one memory device is not limited by the embodiment shown in FIG. 3.

The plane may be a unit for independently performing a write operation, a read operation, or an erase operation. Therefore, the memory device 100 may include the address decoder 130 and a read/write circuit (not shown) for each plane.

In an embodiment, each of super blocks SB1 to SBg may include at least two memory blocks included in different planes among memory blocks respectively included in a plurality of planes included in one memory device. The memory device 100 which stores data in units of super blocks may simultaneously perform an operation on the plurality of planes Plane 1 to Plane 4 (Multi-Plane Operation).

In an embodiment, the plurality of memory blocks BLK1 to BLKi may include a plurality of user blocks UB, a plurality of reserved blocks RB, and a plurality of power loss protection blocks PLPB.

For example, each of first to gth memory blocks BLK1 to BLKg respectively included in the plurality of planes Plane 1 to Plane 4 may be a user block UB. The user block UB may store write-requested data.

Each of (g+1)th to hth memory blocks BLKg+1 to BLKh respectively included in the plurality of planes Plane 1 to Plane 4 may be a reserved block RB. The reserved block RB may be a memory block for substituting for a user block UB. For example, the reserved block RB may be a memory block for substituting for a user block UB determined as a bad block among the plurality of user blocks UB. The bad block may mean a user block UB in which a write operation error occurs. The write operation error may occur when a write operation on data fails.

Each of (h+1)th to ith memory blocks BLKh+1 to BLKi respectively included in the plurality of planes Plane 1 to Plane 4 may be a power loss protection block PLPB. The power loss protection block PLPB may be a memory block which stores buffer data stored in the buffer memory 300 when a sudden power loss occurs.

Figure 4:
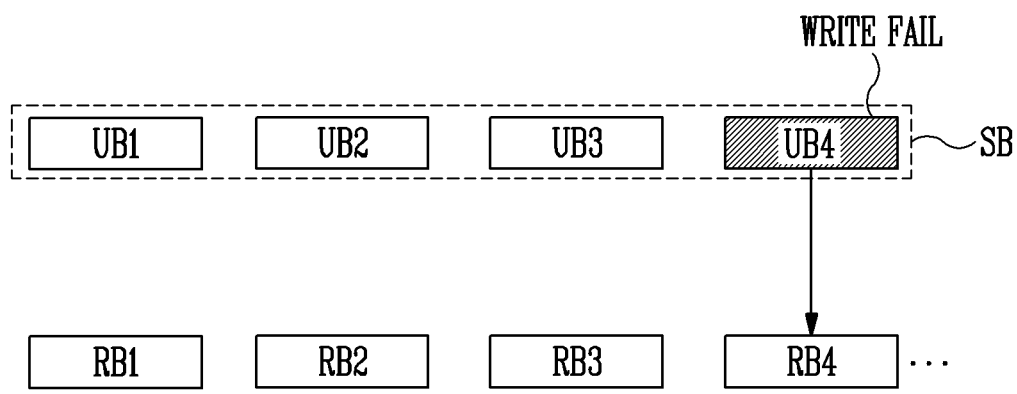
FIG. 4 is a diagram illustrating an operation of substituting a reserved block for a user block in accordance with an embodiment of the present disclosure.

FIG. 4 is a diagram illustrating an operation of substituting a reserved block for a user block in accordance with an embodiment of the present disclosure.

In FIG. 4, a super block SB may include a plurality of user blocks UB1 to UB4. The plurality of user blocks UB1 to UB4 may represent some of the first to gth memory blocks BLK1 to BLKg shown in FIG. 3. In addition, a plurality of reserved blocks RB1 to RB4 may represent some of the (g+1)th to hth memory blocks BLKg+1 to BLKh shown in FIG. 3.

Referring to FIGS. 1 and 4, the write operation controller 210 may control the buffer memory 300 and the memory device 100 to store write-requested data in the plurality of user blocks UB1 to UB4. Under the control of the write operation controller 210, the buffer memory 300 may provide the write-requested data to the memory device 100, and the memory device 100 may store the data provided from the buffer memory 300 in the plurality of user blocks UB1 to UB4. When a write operation error WRITE FAIL occurs in a fourth user block UB4 among the plurality of user blocks UB1 to UB4, the memory block manager 220 may determine the fourth user block UB4 as a bad block.

Also, the memory block manager 220 may substitute any reserved block among the plurality of reserved blocks RB1 to RB4 for the fourth user block UB4. This operation may be designated as a "remap operation." For example, the memory block manager 220 may search for a reserved block for substituting for the fourth user block UB4 among the plurality of reserved blocks RB1 to RB4. When the fourth reserved block RB4 is a free block in which a space capable of storing data exists, the memory block manager 220 may substitute for the fourth user block UB4 by changing the fourth reserved block RB4 to a user block. The super block SB may be reorganized such that the fourth user block UB4 is included therein. Subsequently, the write operation controller 210 may control the buffer memory 300 and the memory device 100 to store the write-requested data in the substituted fourth reserved block RB4. Under the control of the write operation controller 210, the buffer memory 300 may provide the write-requested data to the memory device 100, and the memory device 100 may store the data provided from the buffer memory 300 in the substituted fourth reserved block RB4.

Figure 5:
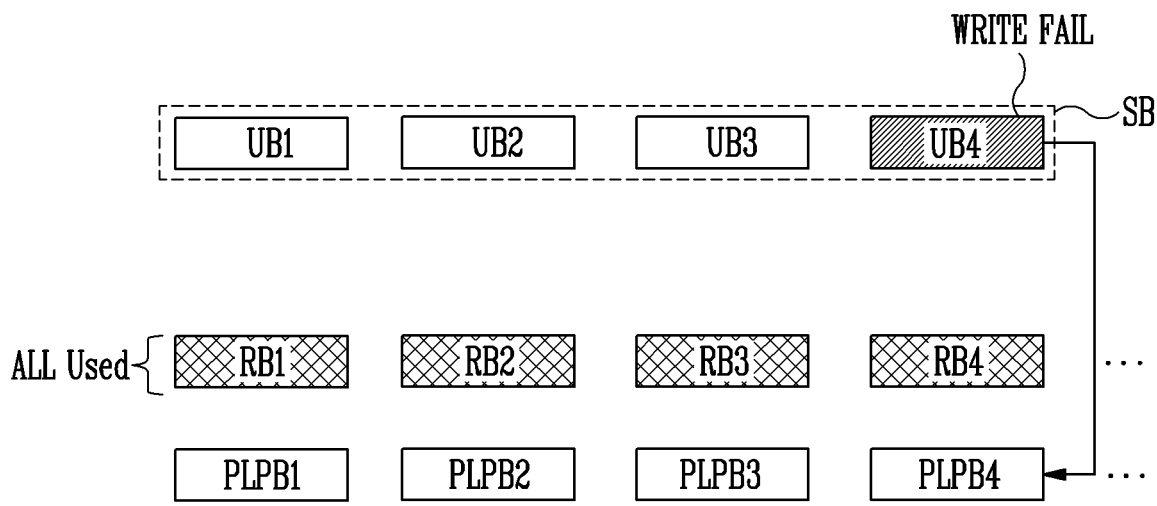
FIG. 5 is a diagram illustrating an operation of changing a power loss protection block to a user block in accordance with an embodiment of the present disclosure.

FIG. 5 is a diagram illustrating an operation of changing a power loss protection block to a user block in accordance with an embodiment of the present disclosure.

In FIG. 5, a super block SB may include a plurality of user blocks UB1 to UB4. The plurality of user blocks UB1 to UB4 may represent some of the first to gth memory blocks BLK1 to BLKg shown in FIG. 3. In addition, a plurality of reserved blocks RB1 to RB4 may represent some of the (g+1)th to hth memory blocks BLKg+1 to BLKh shown in FIG. 3. In addition, a plurality of power loss protection blocks PLPB1 to PLPB4 may represent some of the (h+1)th to ith memory blocks BLKh+1 to BLKi shown in FIG. 3.

Referring to FIGS. 1 and 5, the write operation controller 210 may control the buffer memory 300 and the memory device 100 to store write-requested data in the plurality of user blocks UB1 to UB4. Under the control of the write operation controller 210, the buffer memory 300 may provide the write-requested data to the memory device 100, and the memory device 100 may store the data provided from the buffer memory 300 in the plurality of user blocks UB1 to UB4. When a write operation error WRITE FAIL occurs in a fourth user block UB4 among the plurality of user blocks UB1 to UB4, the memory block manager 220 may determine the fourth user block UB4 as a bad block.

The memory block manager 220 may search for a reserved block for substituting for the fourth user block UB4 among the plurality of reserved blocks RB1 to RB4. The plurality of reserved blocks RB1 to RB4 may all be in use. That is, any reserved block capable of substituting for the fourth user block UB4 among the plurality of reserved blocks RB1 to RB4 may not exist due to a repeated write operation error. The memory block manager 220 may determine that the memory device 100 has entered into the EOL state.

In an embodiment, the memory block manager 220 may change, to user blocks, one or more power loss protection blocks among the plurality of power loss protection blocks PLPB1 to PLPB4. For example, the memory block manager 220 may change a fourth power loss protection block PLPB4 to the user block to substitute for the fourth user block UB4. The super block SB may be reorganized such that the fourth power loss protection block PLPB4 is included therein. Subsequently, when a sudden power loss occurs, the sudden power loss manager 230 may control the buffer memory 300 and the memory device 100 to store the write-requested data in the fourth power loss protection block PLPB4 changed to the user block. Under the control of the sudden power loss manager 230, the buffer memory 300 may provide the write-requested data to the memory device 100, and the memory device 100 may store the data provided from the buffer memory 300 in the fourth power loss protection block PLPB4.

Thus, in accordance with the embodiment of the present disclosure, when any reserved block for substituting for a user block determined as a bad block does not exist due to a write operation error which repeatedly occurs, a power loss protection block is changed to the user block, so that write-requested data can be guaranteed.

Figure 6:
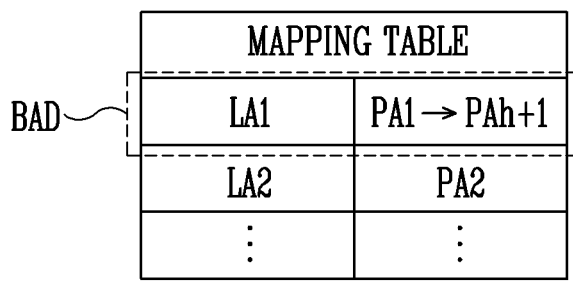
FIG. 6 is a diagram illustrating a mapping table for changing a power loss protection block to a user block in accordance with an embodiment of the present disclosure.

FIG. 6 is a diagram illustrating a mapping table for changing a power loss protection block to a user block in accordance with an embodiment of the present disclosure.

Referring to FIG. 6, the mapping table may store a mapping relationship between logical addresses LA1, LA2, . . . corresponding to a plurality of user blocks and physical addresses PA1, PA2, . . . .

In an embodiment, a user block corresponding to a first logical address LA1 may be determined as a bad block. The memory block manager 220 may substitute any power loss protection block among a plurality of power loss protection blocks for the user block determined as the bad block. The memory block manager 220 may update the mapping table such that the logical address corresponding to the user block is mapped to a physical address of the substituted reserved block. For example, the memory block manager 220 may update the mapping table such that the first logical address LA1 is mapped to a (h+1)th physical address PAh+1 as the physical address of the substituted reserved block.

Figure 7:
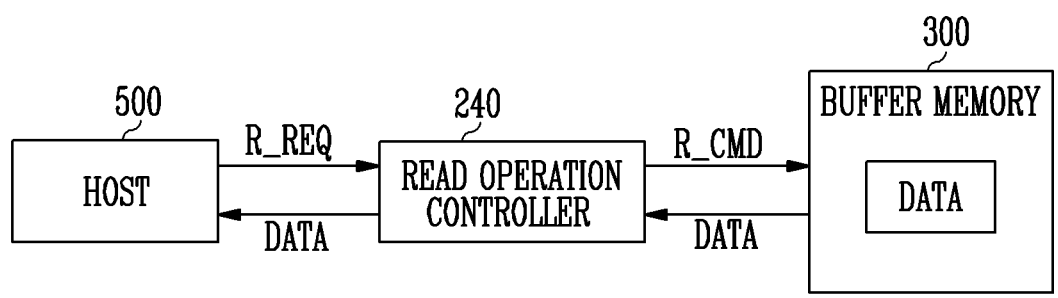
FIG. 7 is a diagram illustrating an example of a read operation in accordance with an embodiment of the present disclosure.

FIG. 7 is a diagram illustrating an example of a read operation in accordance with an embodiment of the present disclosure.

Specifically, FIG. 7 may be a diagram illustrating a read operation when a read request is received before a sudden power loss occurs.

Referring to FIG. 7, the buffer memory 300 may store data DATA write-requested from the host 500. In an embodiment, any memory block capable of storing the write-requested data DATA among a plurality of user blocks and a plurality of reserved blocks may not exist according to a write operation error. Before sudden power loss occurs, the read operation controller 240 may receive a read request R_REQ for the data DATA from the host 500. The read operation controller 240 may generate a read command R_CMD corresponding to the read request R_REQ, and provide the read command R_CMD to the buffer memory 300. The buffer memory 300 may provide the data DATA to the read operation controller 240 in response to the read command R_CMD. The read operation controller 240 may provide the host 500 with the data DATA read from the buffer memory 300.

Figure 8:
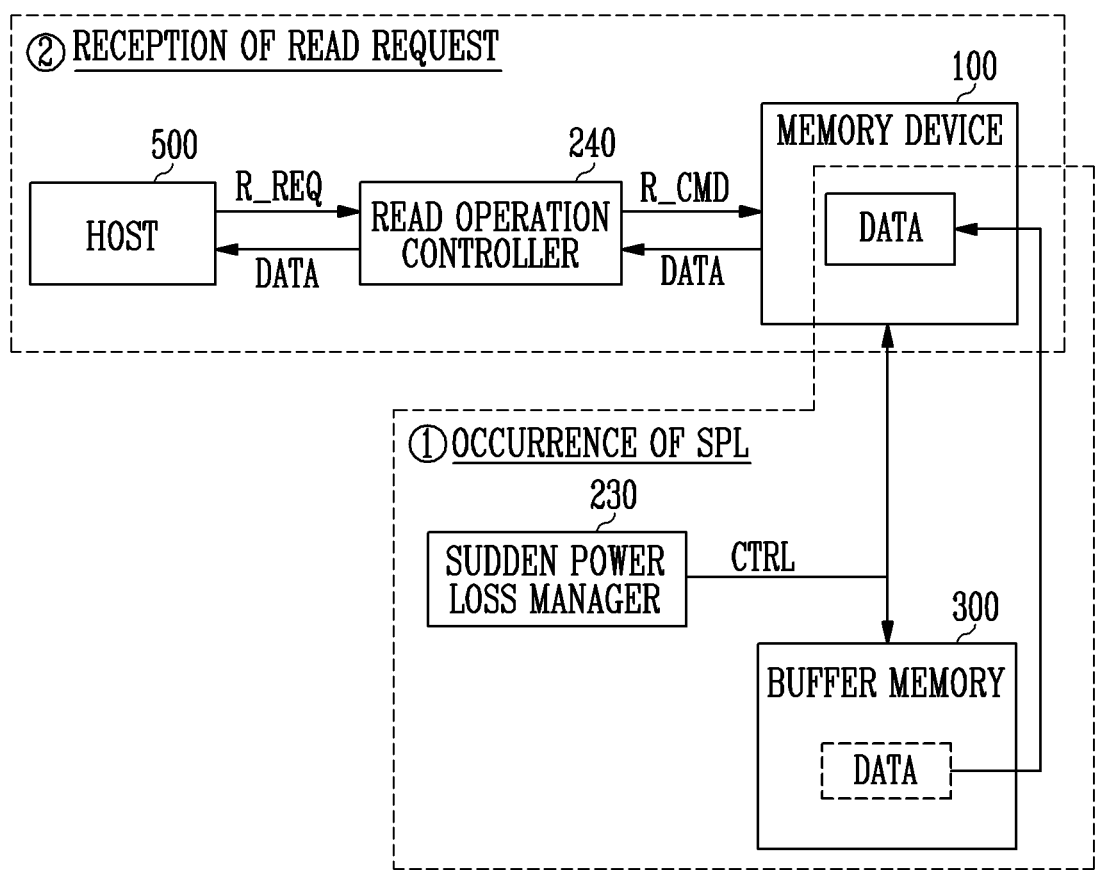
FIG. 8 is a diagram illustrating another example of a read operation in accordance with an embodiment of the present disclosure.

FIG. 8 is a diagram illustrating another example of a read operation in accordance with an embodiment of the present disclosure.

Specifically, FIG. 8 may be a diagram illustrating a read operation when a read request is received after a sudden power loss occurs. Referring to FIG. 8, the buffer memory 300 may store data DATA write-requested from the host 500. In an embodiment, any memory block capable of storing the write-requested data DATA among a plurality of user blocks and a plurality of reserved blocks may not exist according to a write operation error. One or more power loss protection blocks may be changed to user blocks. Subsequently, when sudden power loss occurs (①), the sudden power loss manager 230 may control the buffer memory 300 and the memory device 100 to store the write-requested data DATA in the power loss protection blocks changed to the user blocks. Under the control of the sudden power loss manager 230, the buffer memory 300 may provide the write-requested data DATA to the memory device 100, and the memory device 100 may store the data DATA provided from the buffer memory 300 in the power loss protection blocks changed to the user blocks.

In an embodiment, power supply may be recovered after the sudden power loss occurs. Subsequently, the read operation controller 240 may receive a read request R_REQ for the data DATA from the host 500 (②). The read operation controller 240 may generate a read command R_CMD corresponding to the read request R_REQ, and provide the read command R_CMD to the memory device 100. The memory device 100 may read the data DATA from the power loss protection blocks in response to the read command R_CMD. The memory device 100 may provide the read data DATA to the read operation controller 240. The read operation controller 240 may provide the host 500 with the data DATA read from the power loss protection blocks.

Figure 9:
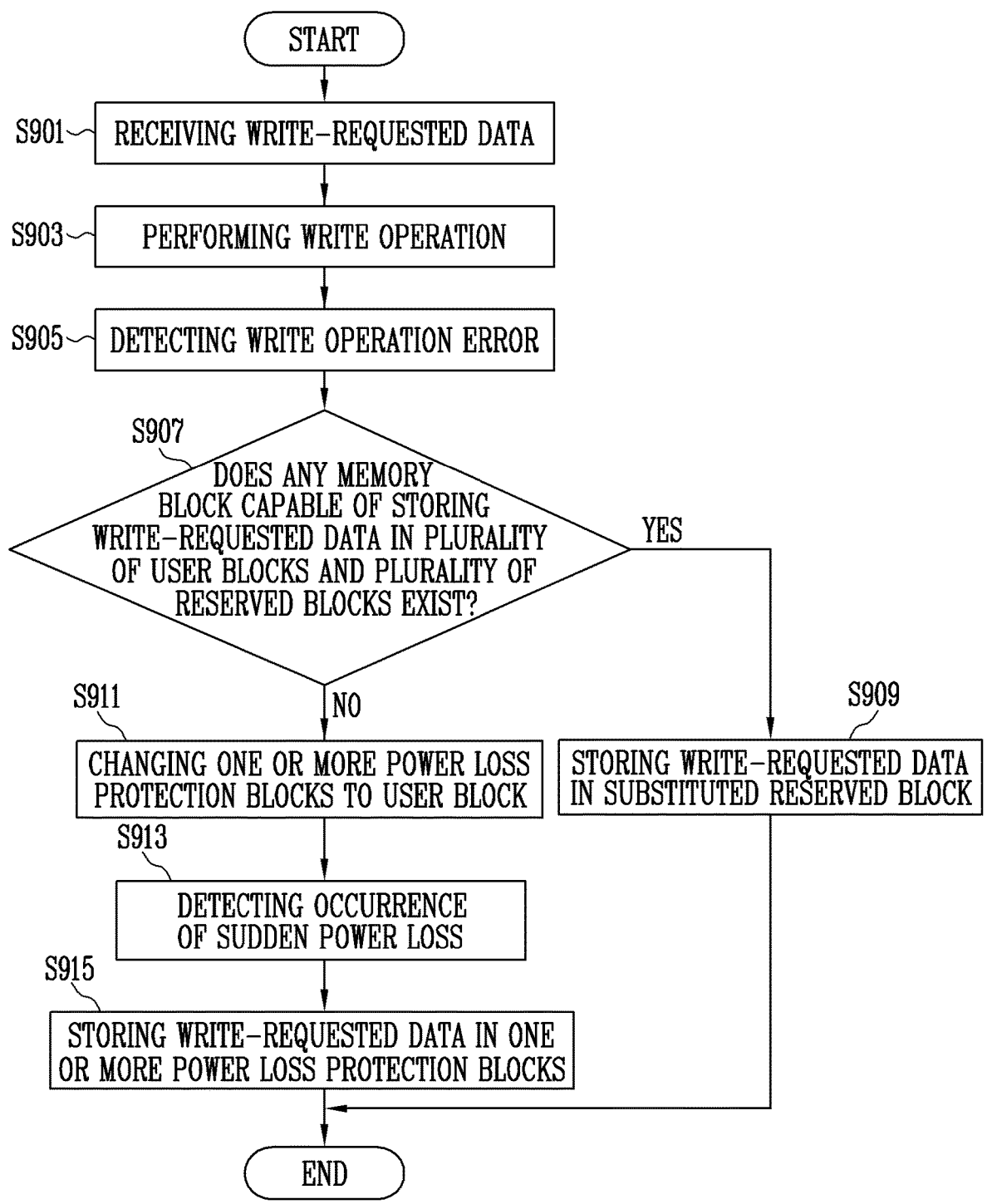
FIG. 9 is a flowchart illustrating an operating method of a storage device in accordance with an embodiment of the present disclosure.

FIG. 9 is a flowchart illustrating an operating method of a storage device in accordance with an embodiment of the present disclosure.

The operating method shown in FIG. 9 may be performed by, for example, the storage device 50 shown in FIG. 1.

Referring to FIG. 9, in operation S901, the storage device 50 may receive write-requested data from the host 500. The write-requested data may be stored in the buffer memory 300.

In operation S903, the storage device 50 may perform a write operation. The write operation may be an operation of storing the write-requested data in a plurality of user blocks and a plurality of reserved blocks.

In operation S905, the storage device 50 may detect a write operation error of the plurality of user blocks and the plurality of reserved blocks.

In operation S907, the storage device 50 may determine whether any memory block capable of storing the write-requested data among the plurality of user blocks and the plurality of reserved blocks exists, in response to the write operation error. When a memory block capable of storing the write-requested data exists, the storage device 50 may perform operation S909. Alternatively, when any memory block capable of storing the write-requested data does not exist, the storage device 50 may perform operation S911.

For example, the storage device 50 may determine whether any reserved block for substituting for a user block in which the write operation error occurs among the plurality of reserved blocks exists. The storage device 50 may determine that a memory block capable of storing the write-requested data exists, in response to a reserved block for substituting for the user block in which the write operation error occurs exists. In the operation S909, the storage device 50 may substitute the reserved block for the user block, and store the write-requested data in the substituted reserved block.

Alternatively, the storage device 50 may determine that any memory block capable of storing the write-requested data does not exist, in response to any reserved block for substituting for the user block in which the write operation error occurs does not exist. In the operation S911, the storage device 50 may change one or more power loss protection blocks to the user blocks.

In operation S913, the storage device 50 may detect occurrence of a sudden power loss.

In operation S915, the storage device 50 may store the write-requested data stored in the buffer memory in the one or more power loss protection blocks, which are changed to the user blocks in the operation S911, in response to the occurrence of the sudden power loss.

Figure 10:
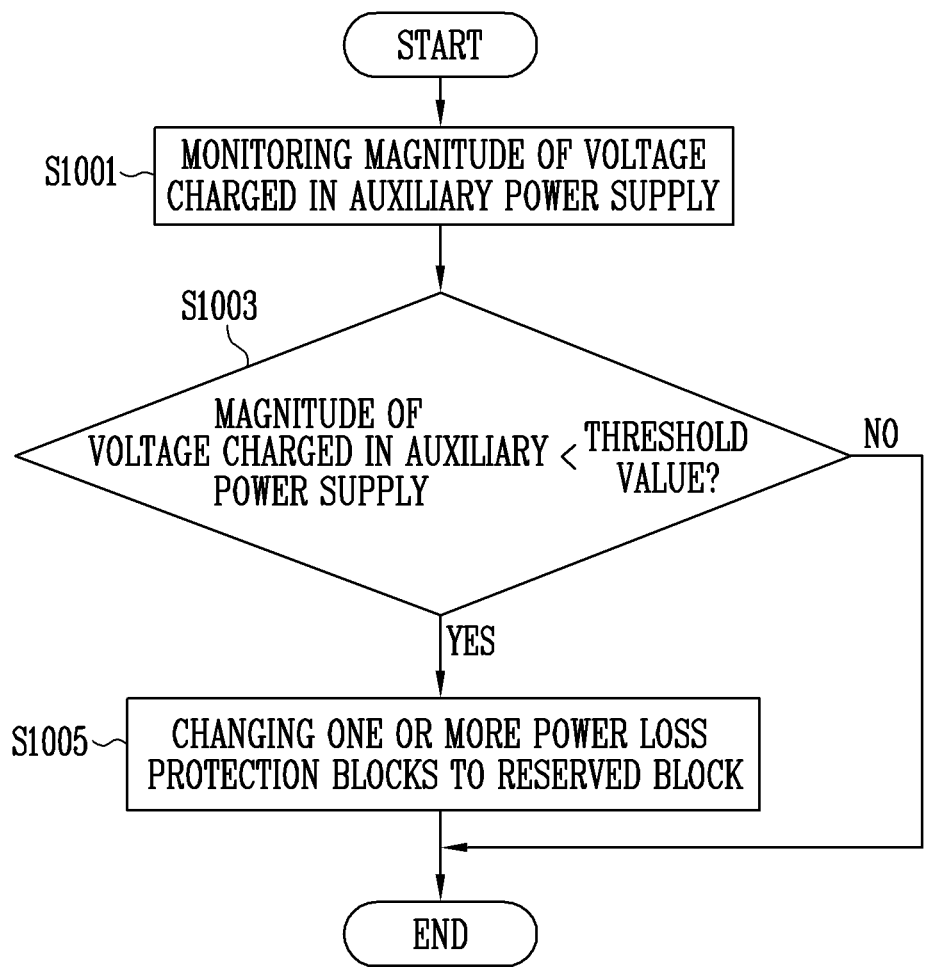
FIG. 10 is a flowchart illustrating another example of an operating method of a storage device in accordance with an embodiment of the present disclosure.

FIG. 10 is a flowchart illustrating another example of an operating method of a storage device in accordance with an embodiment of the present disclosure.

The operating method shown in FIG. 10 may be performed by, for example, the storage device 50 shown in FIG. 1.

Referring to FIG. 10, in operation S1001, the storage device 50 may monitor a magnitude of a voltage charged in the auxiliary power supply 400.

In operation S1003, the storage device 50 may determine whether the magnitude of the voltage charged in the auxiliary power supply 400 is less than a threshold value. When the magnitude of the charged voltage is equal to or greater than the threshold value, the storage device may end the operating method. Alternatively, when the magnitude of the charged voltage is less than the threshold value, the storage device 50 may perform operation S1005.

In the operation S1005, the storage device 50 may change one or more power loss protection blocks to reserved blocks. For example, the one or more power loss protection blocks are the other power loss protection blocks except power loss protection blocks used for storing the buffer data according to the magnitude of the charged voltage in occurrence of a sudden power loss among a plurality of power loss protection blocks.

Figure 11:
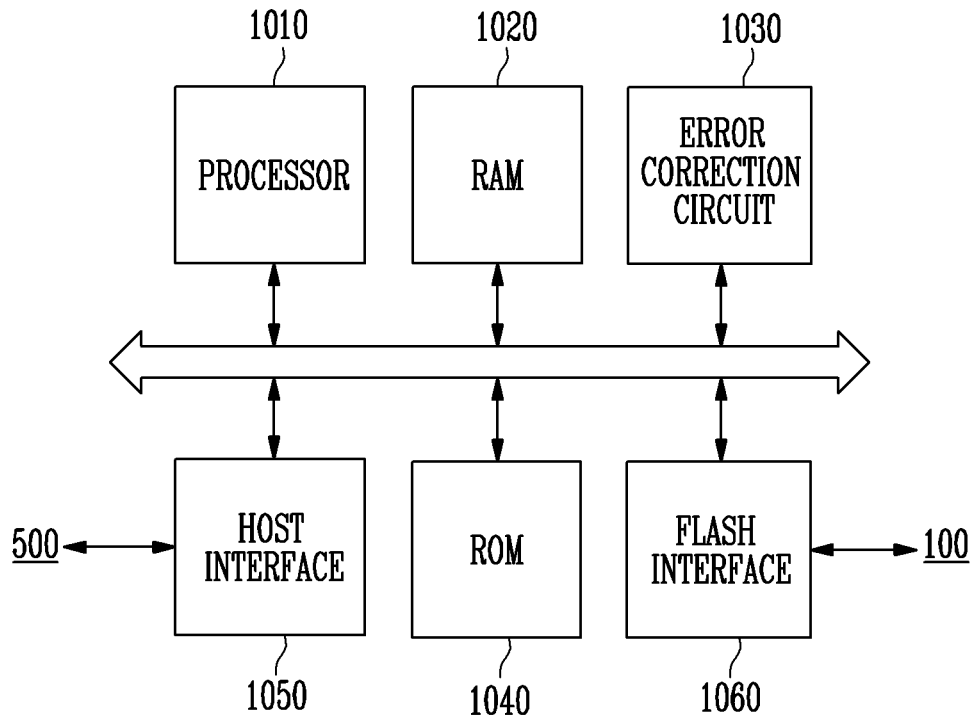
FIG. 11 is a diagram illustrating another example of a memory controller shown in FIG. 1 in accordance with an embodiment of the present disclosure.

FIG. 11 is a diagram illustrating another example of the memory controller shown in FIG. 1 in accordance with an embodiment of the present disclosure.

Descriptions of the memory controller 200 shown in FIG. 2 may be equally applied to a memory controller 1000 shown in FIG. 11.

Referring to FIGS. 1 and 11, the memory controller 1000 may include a processor 1010, a RAM 1020, an error correction circuit 1030, ROM 1040, a host interface 1050, and a flash interface 1060.

The processor 1010 may control overall operations of the memory controller 1000. The write operation controller 210, the memory block manager 220, the sudden power loss manager 230, and the read operation controller 240, which are shown in FIG. 1, may be implemented as one component of the processor 1010. Therefore, the processor 1010 may equally perform operations of the write operation controller 210, the memory block manager 220, the sudden power loss manager 230, the read operation controller 240, and the auxiliary power supply manager 250, which are described with reference to FIG. 1. For example, the processor 1010 may control a write operation on write-requested data. Also, the processor 1010 may substitute a reserved block for a user block in response to a write operation error, or change a power loss protection block to a user block. Also, the processor 1010 may sense occurrence of a sudden power loss, and perform a sudden power loss recovery operation. Also, the processor 1010 may control a read operation in response to a read request of the host 500.

The RAM 1020 may be used as a buffer memory, a cache memory, a working memory, or the like of the memory controller 1000. In an embodiment, the buffer memory 300 shown in FIG. 1 may be implemented as one component of the RAM 1020. For example, the RAM 1020 may store the write-requested data.

The error correction circuit 1030 may perform error correction. The error correction circuit 1030 may perform error correction code (ECC) encoding on data to be written to the memory device 100 through the flash interface 1060. The ECC-encoded data may be transferred to the memory device 100 through the flash interface 1060. The error correction circuit 1030 may perform ECC decoding on data received from the memory device 100 through the flash interface 1060. The error correction circuit 1030 may be included as a component of the flash interface 1060 in the flash interface 1060.

The ROM 1040 may store, in the form of firmware, various information required in an operation of the memory controller 1000.

The memory controller 1000 may communicate with an external device (e.g., the host 500, an application processor, or the like) through the host interface 1050.

The memory controller 1000 may communicate with the memory device 100 through the flash interface 1060. The memory controller 1000 may transmit a command, an address, a control signal, and the like to the memory device 100 through the flash interface 1060, and receive data DATA. The flash interface 1060 may include a NAND interface.

Figure 12:
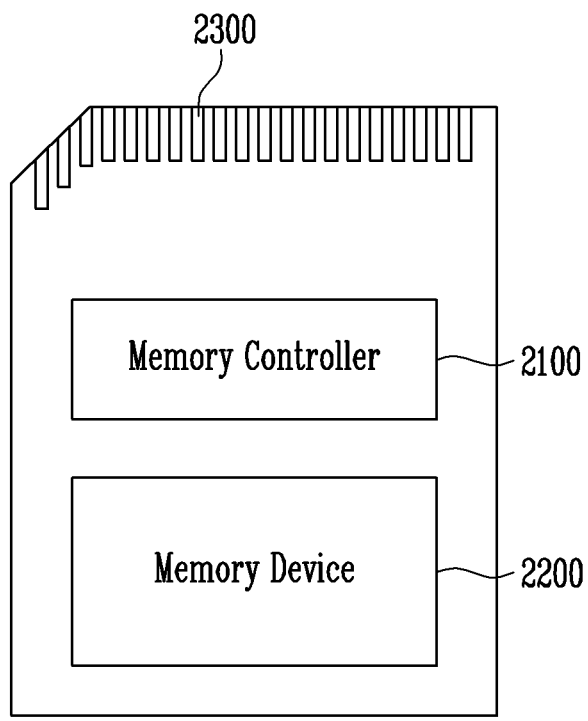
FIG. 12 is a block diagram illustrating a memory card system to which the storage device in accordance with an embodiment of the present disclosure is applied.

FIG. 12 is a block diagram illustrating a memory card system to which the storage device is applied in accordance with an embodiment of the present disclosure.

Referring to FIG. 12, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 1.

The memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. The memory controller 2100 may communicate with the external device through at least one of various communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication protocols.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 13:
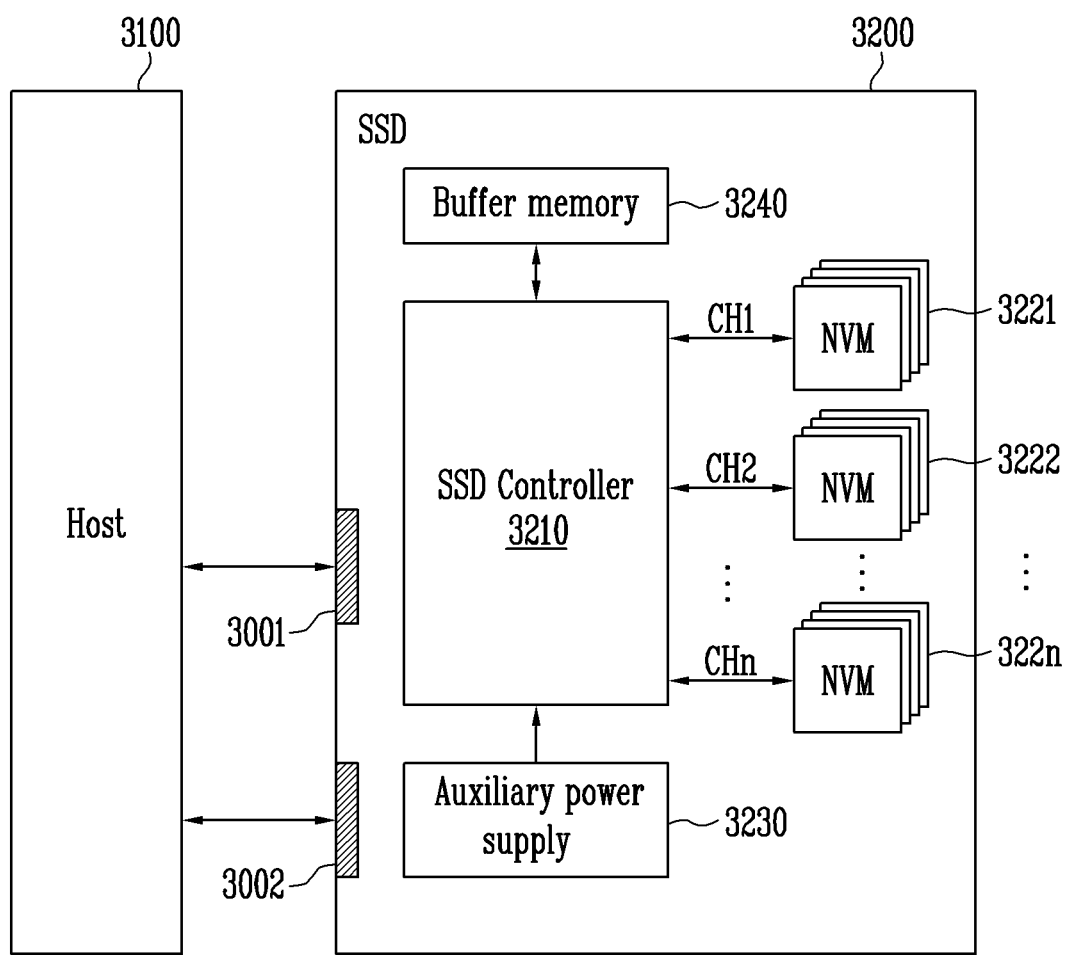
FIG. 13 is a block diagram illustrating a Solid State Drive (SSD) system to which the storage device is applied in accordance with an embodiment of the present disclosure.

FIG. 13 is a block diagram illustrating a Solid State Drive (SSD) system to which the storage device is applied in accordance with an embodiment of the present disclosure.

Referring to FIG. 13, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a Wi-Fi, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 14:
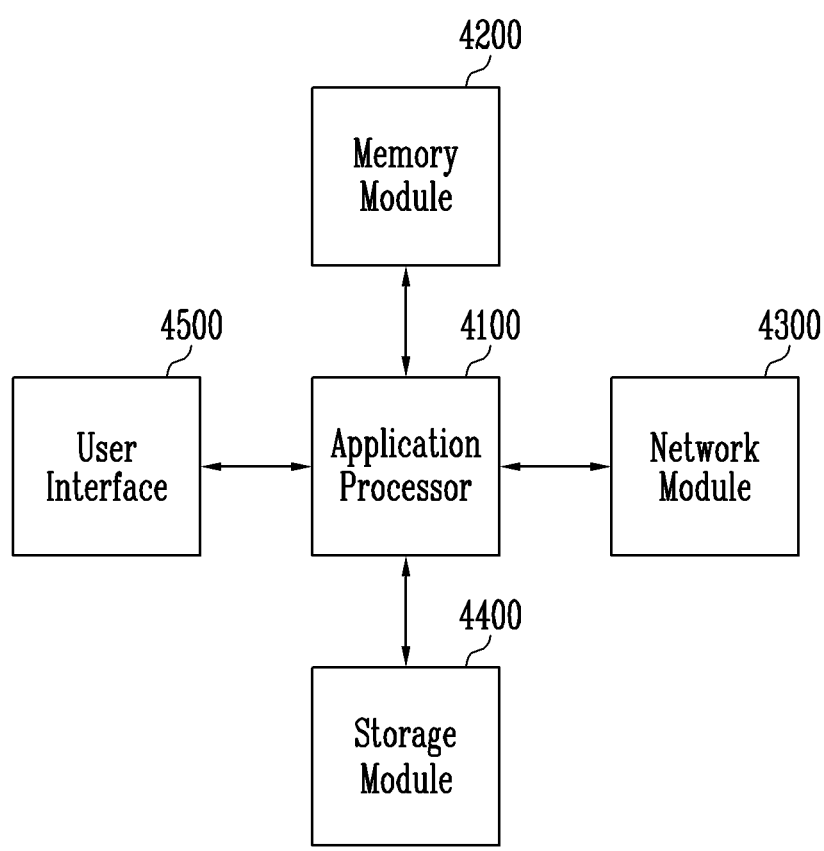
FIG. 14 is a block diagram illustrating a user system to which the storage device is applied in accordance with an embodiment of the present disclosure.

FIG. 14 is a block diagram illustrating a user system to which the storage device is applied in accordance with an embodiment of the present disclosure.

Referring to FIG. 14, the user system 4000 includes an application processor 4100, a memory module 4200, a network module 4300, a storage module 4400, and a user interface 4500.

The application processor 4100 may drive components included in the user system 4000, an operating system (OS), a user program, or the like. The application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and the memory module 4200 may be provided as one semiconductor package by being packaged based on a Package on Package (PoP).

The network module 4300 may communicate with external devices. The network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), WiMAX, WLAN, UWB, Bluetooth, and Wi-Fi. The network module 4300 may be included in the application processor 4100.

The storage module 4400 may store data. For example, the storage module 4400 may store data received from the application processor 4100. Alternatively, the storage module 4400 may transmit data stored therein to the application processor 4100. The storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 4400 may be provided as a removable drive such as a memory card of the user system 4000 or an external drive.

The storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. The user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, there is provided a storage device capable of guaranteeing data write-requested from a host, and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims.

What is claimed is:

1. A storage device comprising:
a buffer memory configured to store data write-requested from a host;
a memory device including a plurality of user blocks, a plurality of reserved blocks which substitute for the plurality of user blocks, and a plurality of power loss protection blocks for storing therein buffer data from the buffer memory when a sudden power loss occurs, the sudden power loss causing abnormal interruption of a power supply to the storage device; and
a memory controller configured to:
determine whether any memory block capable of storing the write-requested data among the plurality of user blocks and the plurality of reserved blocks exists in response to a write operation error of the plurality of user blocks and the plurality of reserved blocks, and
change to user blocks, one or more power loss protection blocks among the plurality of power loss protection blocks according to the determination.

2. The storage device of claim 1, wherein the write operation error occurs when a write operation of storing the write-requested data in one of the plurality of user blocks and the plurality of reserved blocks fails.

3. The storage device of claim 1, wherein, when the write operation error occurs in the plurality of user blocks, the memory controller determines that any memory block capable of storing the write-requested data among the plurality of user blocks does not exist.

4. The storage device of claim 3, wherein, when any reserved block for substituting for the plurality of user blocks among the plurality of reserved blocks does not exist, the memory controller determines that any memory block capable of storing the write-requested data among the plurality of reserved blocks does not exist.

5. The storage device of claim 4, wherein the memory controller is further configured to determine that the memory device has entered into an End Of Life (EOL) state when any reserved block for substituting for the plurality of user blocks does not exist.

6. The storage device of claim 1, wherein, when any memory block capable of storing the write-requested data among the plurality of user blocks and the plurality of reserved blocks does not exist, the memory controller changes the one or more power loss protection blocks to the user blocks.

7. The storage device of claim 1, wherein, when the sudden power loss occurs, the memory controller is further configured to control the buffer memory and the memory device to store the write-requested data stored in the buffer memory in the user blocks that are changed from the one or more power loss protection blocks.

8. The storage device of claim 7, wherein, when a read request for the write-requested data is received from the host after the power supply is recovered, the memory controller is further configured to control the memory device to read data corresponding to the read request from the user blocks that are changed from the one or more power loss protection blocks, and provide the host with the read data.

9. A storage device comprising:
an auxiliary power supply configured to supply an auxiliary power source to a memory device and a memory controller;
the memory device including a plurality of user blocks, a plurality of reserved blocks for substituting for the plurality of user blocks, and a plurality of power loss protection blocks for storing buffer data stored in a buffer memory when a sudden power loss occurs, in which a power supply is abnormally interrupted; and
the memory controller configured to change to reserved blocks, one or more power loss protection blocks among the plurality of power loss protection blocks, based on a magnitude of a voltage charged in the auxiliary power supply.

10. The storage device of claim 9, wherein, when the magnitude of the charged voltage is less than a threshold value, the memory controller changes the one or more power loss protection blocks to the reserved blocks.

11. The storage device of claim 10, wherein the one or more power loss protection blocks are the other power loss protection blocks except power loss protection blocks used for storing the buffer data according to the magnitude of the charged voltage in occurrence of the sudden power loss among the plurality of power loss protection blocks.

12. The storage device of claim 9, wherein, when the magnitude of the charged voltage is less than a threshold value, the memory controller is further configured to determine that the memory device has entered into an End Of Life (EOL) state.

13. A memory system comprising:
a memory device including first memory blocks designated to operate for a first purpose and second memory blocks designated to operate for a second purpose; and
a memory controller configured to determine whether any memory block capable of operating for the first purpose among the first memory blocks exists in response to an error, which occurs in the first memory blocks, of an operation for the first purpose, and re-designate at least one second memory block among the second memory blocks to operate for the first purpose when determining the first memory blocks as incapable of operating for the first purpose,
wherein the first purpose is storing, in a memory block, write-requested data buffered in a buffer memory.

14. The memory system of claim 13,
wherein the second purpose is storing, in the second memory blocks, buffer data stored in the buffer memory when a sudden power loss occurs in a storage device including the memory device and the memory controller.

15. The memory system of claim 13, wherein the memory controller is configured to determine that the memory device has entered into an End Of Life (EOL) state when determining the first memory blocks as incapable of operating for the first purpose.

16. The memory system of claim 14, wherein the buffer data includes the write-requested data, and
wherein, when the sudden power loss occurs, the memory controller is further configured to control the buffer memory and the memory device to store, in the second memory blocks that are re-designated to operate for the first purpose, the write-requested data among the buffer data stored in the buffer memory.

17. The memory system of claim 16, wherein, when a read request for the write-requested data is received from a host after a power supply is recovered, the memory controller is further configured to control the memory device to read data corresponding to the read request from the second memory blocks that are re-designated to operate for the first purpose, and provide the host with the read data.

18. The memory system of claim 16,
wherein the buffer data includes the write-requested data, and
when a read request for the write-requested data is received from a host before the sudden power loss occurs, the memory controller is further configured to provide the host with the write-requested data that are stored in the buffer memory.

* * * * *